United States Patent
Kataoka et al.

(10) Patent No.: US 10,693,184 B2
(45) Date of Patent: Jun. 23, 2020

(54) LITHIUM-CONTAINING GARNET CRYSTAL BODY, METHOD FOR PRODUCING SAME, AND ALL-SOLID-STATE LITHIUM ION SECONDARY BATTERY

(71) Applicant: NATIONAL INSTITUTE OF ADVANCED INDUSTRIAL SCIENCE AND TECHNOLOGY, Tokyo (JP)

(72) Inventors: Kunimitsu Kataoka, Tsukuba (JP); Junji Akimoto, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 370 days.

(21) Appl. No.: 15/329,750

(22) PCT Filed: Jul. 30, 2015

(86) PCT No.: PCT/JP2015/071681
§ 371 (c)(1),
(2) Date: Jan. 27, 2017

(87) PCT Pub. No.: WO2016/017769
PCT Pub. Date: Feb. 4, 2016

(65) Prior Publication Data
US 2017/0222258 A1    Aug. 3, 2017

(30) Foreign Application Priority Data
Jul. 31, 2014  (JP) ................................ 2014-156038

(51) Int. Cl.
*H01M 10/0562* (2010.01)
*H01M 10/0525* (2010.01)
(Continued)

(52) U.S. Cl.
CPC ........ *H01M 10/0562* (2013.01); *C01G 25/00* (2013.01); *C01G 25/006* (2013.01);
(Continued)

(58) Field of Classification Search
CPC ...... C01G 25/00; C01G 25/006; C30B 13/28; C30B 15/20; C30B 29/22; H01M 10/0525;
(Continued)

(56) References Cited

U.S. PATENT DOCUMENTS

2015/0024292 A1*  1/2015  Yamada ................ H01M 12/08
429/405

FOREIGN PATENT DOCUMENTS

JP    2010-14378        1/2010
JP    2010-143785 A    7/2010
(Continued)

OTHER PUBLICATIONS

Kar et al. "Growth Optimization and Optical Characteristics of Fe Doped LiNbO3 Crystals" in Crystal Growth & Design, vol. 8, No. 12, 2008, p. 4424-4427 (Year: 2008).*
(Continued)

*Primary Examiner* — Jonathan G Jelsma
*Assistant Examiner* — Omar M Kekia
(74) *Attorney, Agent, or Firm* — Studebaker & Brackett PC

(57) ABSTRACT

Provided is a high-density lithium-containing garnet crystal body. The lithium-containing garnet crystal body has a relative density of 99% or more, belongs to a tetragonal system, and has a garnet-related type structure. A method of producing a $Li_7La_3Zr_2O_{12}$ crystal, which is one example of this lithium-containing garnet crystal body, includes melting a portion of a rod-like raw material composed of polycrystalline $Li_7La_3Zr_2O_{12}$ belonging to a tetragonal system while
(Continued)

rotating it on a plane perpendicular to the longer direction and moving the melted portion in the longer direction. The moving rate of the melted portion is preferably 8 mm/h or more but not more than 19 mm/h. The rotational speed of the raw material is preferably 30 rpm or more but not more than 60 rpm. By increasing the moving rate of the melted portion, decomposition of the raw material due to evaporation of lithium can be prevented and by increasing the rotational speed of the raw material, air bubbles can be removed.

12 Claims, 4 Drawing Sheets

(51) Int. Cl.
*C01G 25/00* (2006.01)
*C30B 13/28* (2006.01)
*C30B 29/22* (2006.01)
*C30B 15/20* (2006.01)

(52) U.S. Cl.
CPC .............. *C30B 13/28* (2013.01); *C30B 15/20* (2013.01); *C30B 29/22* (2013.01); *H01M 10/0525* (2013.01); *C01P 2002/30* (2013.01); *C01P 2002/70* (2013.01); *C01P 2002/72* (2013.01); *C01P 2002/77* (2013.01); *C01P 2004/01* (2013.01); *C01P 2006/10* (2013.01); *C01P 2006/40* (2013.01); *H01M 2220/30* (2013.01); *H01M 2300/0071* (2013.01)

(58) Field of Classification Search
CPC ..... H01M 10/0562; H01M 2300/0071; H01M 2220/30; C01P 2006/40; C01P 2006/10; C01P 2004/01; C01P 2002/77; C01P 2002/70; C01P 2002/30; C01P 2002/72
USPC ........................................................ 429/322
See application file for complete search history.

(56) References Cited

FOREIGN PATENT DOCUMENTS

JP          5131854          1/2013
WO     WO2013/161516     * 10/2013  ............ H01M 12/08

OTHER PUBLICATIONS

Awaka et al. "Synthesis and structure analysis of tetragonal Li3La3Zr2O12 with the garnet-related type structure" in Journal of Solid State Chemistry, 182 (2009) 2046-2052 (Year: 2009).*
JP2010-143785A Published Jul. 1, 2010, English Translation (16 pages).
JP2010-14378 Published Jan. 21, 2010, English Translation (20 pages).
Zhang et al., Field assisted sintering of dense Al-substituted cubic phase Li7La3Zr2O12 solid electrolytes, Journal of Power Sources, vol. 268, Dec. 5, 2014, pp. 960-964.
Awaka, J., et al., "Synthesis and structure analysis of tetragonal Li7La3Zr2O12 with the garnet-related type structure," National Institute of Advanced Industrial Science and Technology (AIST), Journal of Solid State Chemistry,182 (2009); pp. 2046-2052.
English Text Translation of Japanese Patent Application No. 5131854 B, Published on Jan. 30, 2013; 18 pages.

* cited by examiner

LITHIUM-CONTAINING GARNET CRYSTAL BODY, METHOD FOR PRODUCING SAME, AND ALL-SOLID-STATE LITHIUM ION SECONDARY BATTERY

CROSS REFERENCE TO RELATED APPLICATIONS

This application is the U.S. National Phase Application under 35 U.S.C. 371 of International Application No. PCT/JP2015/071681 "Lithium-Containing Garnet Crystal Body, Method for Producing Same, and All-Solid-State Lithium Ion Secondary Battery" filed on 30 Jul. 2015, which claims priority to Japanese Patent Application JP 2014-156038, filed on 31 Jul. 2014, which the contents of these applications are incorporated by reference herein in their entireties.

TECHNICAL FIELD

The present invention relates to a high density lithium-containing garnet crystal body, a method of producing same, and an all-solid-state lithium ion secondary battery using this lithium-containing garnet crystal body as a solid electrolyte.

BACKGROUND ART

Lithium ion secondary batteries have been used for small information devices such as cellular phones or book-sized personal computers because they have a high energy density and can be driven at a high potential. All-solid-state lithium ion secondary batteries not using a flammable electrolyte are under research and development in consideration of safety. A solid electrolyte used for all-solid-state lithium ion secondary batteries is required to have a high ionic conductivity. As an oxide having a high lithium ion conductivity, $Li_7La_3Zr_2O_{12}$ having a tetragonal system garnet-related type crystal structure is known (Patent Document 1).

A solid electrolyte should have reduced grain-boundary resistance or interface resistance in order to have high ion conductivity. A solid electrolyte is therefore desirably a high density molded product. In addition, when a solid electrolyte is a high density molded product, short-circuit between positive and negative electrodes during charging/discharging process can be prevented. Further, the high density molded product can be sliced into thin pieces so that if a solid electrolyte is a high-density molded product, an all-solid-state lithium ion secondary battery can be provided as a small-sized one. Since $Li_7La_3Zr_2O_{12}$ having a garnet-related type crystal structure is however hardly sinterable, a high-density molded product cannot be prepared easily (Non-Patent Document 1).

CITATION LIST

Patent Document

Patent Document 1: Japanese Patent No. 5131854

Non-Patent Document 1

Non-Patent Document 1: J. Awaka, N. Kijima, H. Hayakawa, J. Akimoto, Journal of Solid State Chemistry, 182, P2046-2052 (2009).

SUMMARY

Technical Problem

With the forgoing in view, the present invention has been made. An object of the present invention is to provide a high-density lithium-containing garnet crystal body, a method of producing it, and an all-solid-state lithium ion secondary battery using this lithium-containing garnet crystal body as a solid electrolyte.

Solution to Problem

The present inventors have thought that the above-described problem can be overcome by devising a production method of the crystal body and thereby obtaining a high density $Li_7La_3Zr_2O_{12}$ crystal having no crystal boundary. As a result of intensive investigation on the method of producing a $Li_7La_3Zr_2O_{12}$ crystal including melting a polycrystalline $Li_7La_3Zr_2O_{12}$ sample at high temperature and then cooling it, it has been found that a high density $Li_7La_3Zr_2O_{12}$ crystal having a garnet-related type structure can be grown and the resulting $Li_7La_3Zr_2O_{12}$ crystal can be mechanically sliced into thin pieces, leading to the completion of the invention.

The lithium-containing garnet crystal body of the present invention, for example, a $Li_7La_3Zr_2O_{12}$ crystal has a relative density of 99% or more, belongs to a tetragonal system, and has a garnet-related type structure.

The method of producing a $Li_7La_3Zr_2O_{12}$ crystal according to the present invention includes melting at least a portion of a raw material composed of polycrystalline $Li_7La_3Zr_2O_{12}$ to form a melted portion and moving the melted portion to obtain a $Li_7La_3Zr_2O_{12}$ crystal having a garnet-related type structure. The moving rate of the melted portion is 8 mm/h or more and the relative density of the $Li_7La_3Zr_2O_{12}$ crystal is 99% or more.

The all-solid-state lithium ion secondary battery of the present invention has a positive electrode, a negative electrode, and a solid electrolyte and the solid electrolyte is composed of the lithium-containing garnet crystal body of the present invention.

Advantageous Effects of Invention

The present invention can provide a high-density lithium-containing garnet crystal body and an all-solid-state lithium ion secondary battery using this lithium-containing garnet crystal body as a solid electrolyte.

DESCRIPTION OF EMBODIMENTS

The lithium-containing garnet crystal body, method of producing a $Li_7La_3Zr_2O_{12}$ crystal, and all-solid-state lithium ion secondary battery according to the present invention will hereinafter be described in detail based on Embodiment and Example. It is to be noted that an overlapping description will be omitted as needed.

The lithium-containing garnet crystal body according to the embodiment of the present invention has a relative density of 99% or more, belongs to a tetragonal system, and has a garnet-related type structure. The relative density can be calculated by measuring an external shape of a thin slice of the crystal, calculating an apparent volume, and dividing an apparent density calculated from the measured mass by a true density obtained from single crystal X-ray structural analysis results. The lithium-containing garnet crystal body of the present embodiment has preferably a higher relative density. All the crystal domains of the lithium-containing garnet crystal of the present embodiment do not necessarily face the same direction.

Figure 1:
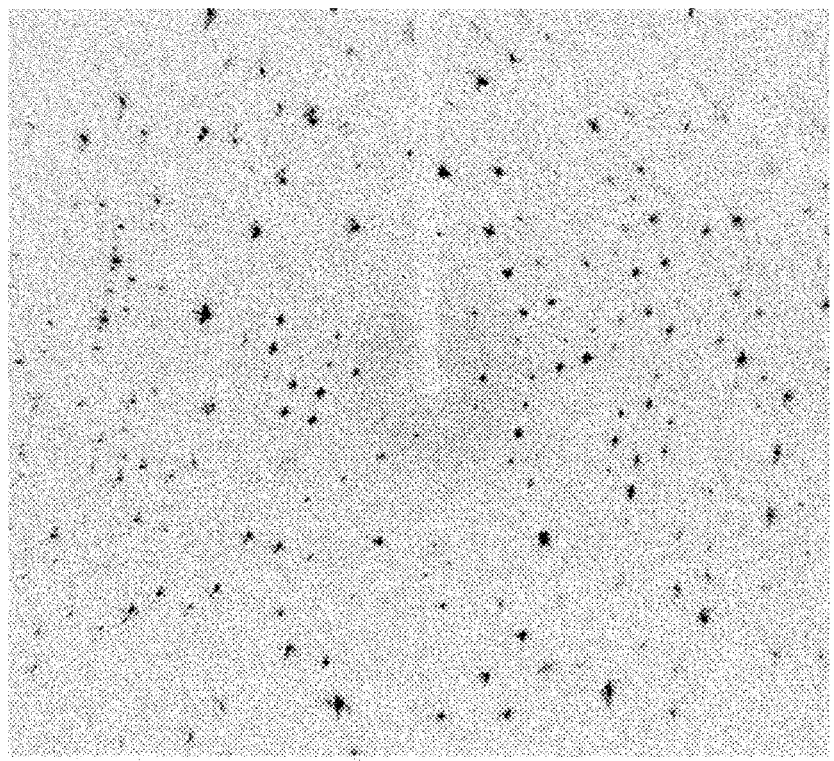
FIG. 1 is a single crystal X-ray diffraction pattern of a tetragonal system $Li_7La_3Zr_2O_{12}$ crystal having a plurality of domains.
Figure 3:
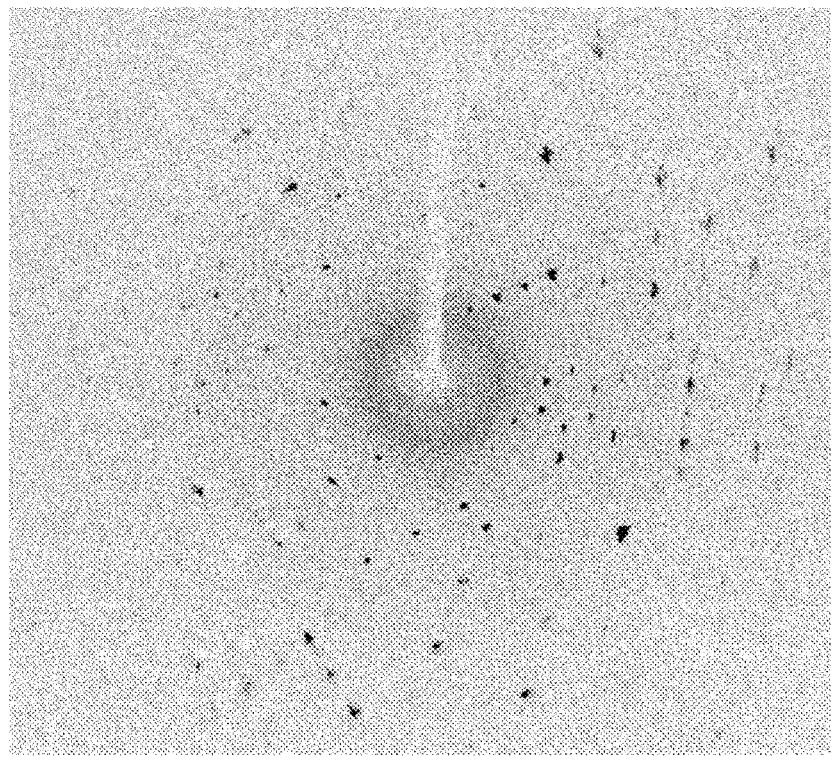
FIG. 3 is a single crystal X-ray diffraction pattern of the tetragonal system $Li_7La_3Zr_2O_{12}$ crystal prepared by the FZ method of Example.

When a lithium-containing garnet crystal body tends to have crystal domains aligned in one direction, a diffraction spot is observed as a clear spot in the X-ray diffraction measurement using a single crystal as shown later in FIG. 3. FIG. 1 is a single crystal X-ray diffraction pattern of a tetragonal system $Li_7La_3Zr_2O_{12}$ crystal having crystal domains not aligned in one direction and prepared in a test. This sample is a tetragonal system $Li_7La_3Zr_2O_{12}$ single crystal prepared by moving the melted portion at 100 mm/h. Too high cooling rate of the melted portion has prevented the crystal from growing to having crystal domains aligned in one direction in the sample.

When the crystal domains of the lithium-containing garnet crystal body are not aligned in one direction, diffraction spots are complicated or diffractions from various domains overlap with each other to form a diffraction spot shaped like a ring as shown in FIG. 1. Examples of the lithium-containing garnet crystal body of the present embodiment include $Li_7La_3Zr_2O_{12}$ crystal, tetragonal system $Li_7La_3Hf_2O_{12}$ crystal, and tetragonal system $Li_7La_3Sn_2O_{12}$ crystal.

A polycrystal body has difficulty in having an increased relative density so that in ac impedance measurement, many voids in the polycrystal body are reflected on the measurement results. The Nyquist plot, by AC impedance measurement, of the $Li_7La_3Zr_2O_{12}$ polycrystal body which has already been reported shows two resistance components, that is, a resistance component due to crystal grain boundaries and a resistance component of the material itself (refer to Non-patent Document 1). On the other hand, the Nyquist plot of the lithium-containing garnet crystal body of the present embodiment shows not a resistance component due to crystal grain boundaries but only a resistance component of the material itself, as shown later in FIG. 6. In the single-crystal X-ray diffraction measurement, neutron diffraction measurement, or electron diffraction measurement of the lithium-containing garnet crystal body of the present embodiment, a ring-shaped crystal spot appears in the diffraction pattern as shown later in FIG. 3.

The lithium-containing garnet crystal body of the present invention has excellent lithium ion conductivity so that it can be used for an electrolyte of an all-solid-state lithium ion second battery. This means that the all-solid-state lithium ion secondary battery of the present invention has a positive electrode, a negative electrode, and a solid electrolyte and the solid electrolyte is composed of the lithium-containing garnet crystal body of the present invention, for example, a $Li_7La_3Zr_2O_{12}$ crystal having a relative density of 99% or more, belonging to a tetragonal system, and having a garnet-related type structure. A $Li_7La_3Zr_2O_{12}$ crystal having a relative density of 100%, that is, an essential $Li_7La_3Zr_2O_{12}$ single crystal has particularly excellent lithium ion conductivity.

A method of producing a $Li_7La_3Zr_2O_{12}$ crystal according to the embodiment of the present invention is a method of melting at least a portion of a raw material composed of polycrystalline $Li_7La_3Zr_2O_{12}$ to form a melted portion and moving the melted portion to produce a $Li_7La_3Zr_2O_{12}$ crystal having a garnet-related type structure. The moving rate of the melted portion is 8 mm/h more and the relative density of the $Li_7La_3Zr_2O_{12}$ crystal is 99% or more. The method of producing a $Li_7La_3Zr_2O_{12}$ crystal according to the present embodiment is a method of growing a $Li_7La_3Zr_2O_{12}$ crystal from a melt of the raw material, more specifically, the floating zone (FZ) method, Czochralski (CZ) method, Bridgman method, Pedestal method or the like corresponds to it. A suitable method may be selected from these methods, depending on the size, shape, or the like of the $Li_7La_3Zr_2O_{12}$ crystal to be produced.

In production of a $Li_7La_3Zr_2O_{12}$ crystal by the FZ method, a rod-like raw material is partially melted while rotating it on a plane perpendicular to its longer direction and moving the melted portion in the longer direction to grow the $Li_7La_3Zr_2O_{12}$ crystal. The rod-like raw material composed of polycrystalline $Li_7La_3Zr_2O_{12}$ is prepared as follows. First, a lithium compound, a lanthanum compound, and a zirconium compound are weighed to give a Li:La:Zr mole ratio of 7-8:3:2 in consideration of evaporation of lithium at high temperature.

The lithium compound is not particularly limited insofar as it contains lithium and examples include $Li_2O$ and $Li_2CO_3$. The lanthanum compound is not particularly limited insofar as it contains lanthanum and examples include $La_2O_3$ and $La(OH)_3$. The zirconium compound is not particularly limited insofar as it contains zirconium and examples include $ZrO_2$ and $ZrCl_4$. It is also possible to use compounds containing two or more of lithium, lanthanum, and zirconium, for example, $La_2Zr_2O_7$ and $Li_2ZrO_3$ and weigh them to give a Li:La:Zr mole ratio of 7-8:3:2.

Next, the compounds thus weighed are mixed. A mixing method is not particularly limited insofar as it can uniformly mix the compounds. For example, they may be mixed in a wet or dry system by a mixing machine such as mixer. After the resulting mixture is poured in a crucible with a lid, it is temporarily calcined at from 900° C. to 1000° C., preferably from 930° C. to 990° C. to obtain a polycrystalline $Li_7La_3Zr_2O_{12}$ powder to be served as a raw material. The product obtained by temporary calcining is preferably ground, mixed, and calcined in repetition. The resulting polycrystalline $Li_7La_3Zr_2O_{12}$ powder belongs to a tetragonal system.

Next, in order to facilitate molding, the polycrystalline $Li_7La_3Zr_2O_{12}$ powder thus obtained is ground to reduce its particle size. A grinding method is not particularly limited insofar as it can grind the powder into small-sized ones. For example, the powder may be wet- or dry-ground using a grinder such as planetary ball mill, pot mill, or beads mill. After the ground product is poured in a rubber tube, it is formed into a rod by isostatic pressing. Next, the product thus formed is calcined at a temperature of from about 800° C. to 1300° C., preferably from 900° C. to 1100° C. to obtain a rod-like polycrystalline $Li_7La_3Zr_2O_{12}$ raw material. This rod-like polycrystalline $Li_7La_3Zr_2O_{12}$ belongs to a tetragonal system.

The resulting rod-like polycrystalline $Li_7La_3Zr_2O_{12}$ raw material belonging to a tetragonal system is melted in an infrared condensing furnace and then quenched. As a result, a $Li_7La_3Zr_2O_{12}$ crystal having a garnet-related type structure is produced. The $Li_7La_3Zr_2O_{12}$ crystal thus produced belongs to a tetragonal system. Decomposition of the raw material due to evaporation of lithium can be prevented by increasing the moving rate of the melted portion to 8 mm/h or more. The moving rate of this melted portion is preferably 8 mm/h or more but not more than 19 mm/h.

At the melted portion, evaporation of lithium is accompanied by generation of air bubbles, but these air bubbles can be removed by increasing the rotational speed of the rod-like polycrystalline $Li_7La_3Zr_2O_{12}$ raw material to 30 rpm or more. The rotational speed of the raw material is preferably 30 rpm or more but not more than 60 rpm. Melting of the raw material and moving of the melted portion are preferably performed in a dry air atmosphere. In such a manner, a high density $Li_7La_3Zr_2O_{12}$ crystal having a relative density of 99% or more can be produced. A $Li_7La_3Zr_2O_{12}$ crystal having a relative density of 100% can also be produced.

Production of a $Li_7La_3Zr_2O_{12}$ crystal by the CZ method is performed in the following procedure. First, a raw material polycrystalline $Li_7La_3Zr_2O_{12}$ is poured in a crucible and is melted by heating. Then, a seed crystal is dipped in a melt of the raw material and then, it is pulled up while rotating. It is presumed that by increasing the moving rate of the melted portion, that is, a pulling rate of the seed crystal to 8 mm/h or more, evaporation of lithium is suppressed and a high density $Li_7La_3Zr_2O_{12}$ crystal can be obtained.

EXAMPLE

1. Production of $Li_7La_3Zr_2O_{12}$ Crystal by FZ Method
(1) Preparation of Polycrystalline $Li_7La_3Zr_2O_{12}$ Powder
First, as starting raw materials, 10.1175 g of lithium carbonate $Li_2CO_3$ (product of RARE METALLIC, purity: 99.99%), 17.4606 g of lanthanum oxide $La_2O_3$ (product of RARE METALLIC, purity: 99.99%), and 8.7648 g of zirconium oxide $ZrO_2$ (product of RARE METALLIC, purity: 99.99%) were poured in an agate mortar and they were uniformly mixed by a wet process using ethanol. As lanthanum oxide, that temporarily calcined at 900° C. in advance was used. Then, an alumina crucible with lid (product of Nikkato, C5 model) was filled with 36 g of the resulting mixture. The crucible was placed in a box type electric furnace (product of Yamato Scientific, FP100 model) and the mixture was temporarily calcined at 950° C. for 5 hours to obtain a powder. The powder thus obtained was ground in a mortar and then calcining at 980° C. for 10 hours was performed twice to prepare a polycrystalline $Li_7La_3Zr_2O_{12}$ powder.

The resulting polycrystalline $Li_7La_3Zr_2O_{12}$ powder was then ground. More specifically, grinding was performed by filling a 45-mL zirconium grinding container with 30 g of the resulting polycrystalline $Li_7La_3Zr_2O_{12}$ powder, 50 g of zirconia balls having a diameter of 5 mm, and 14 mL of ion exchanged water and rotating it in a planetary ball mill (product of Fritsch/Germany, model P-6) for 300 minutes in total at revolution speed of 200 rpm. After grinding, the polycrystalline powder was dried at 100° C. for 24 hours and classified through a sieve with a 250-μm opening.

(2) Preparation of Rod-Like Polycrystalline $Li_7La_3Zr_2O_{12}$
Rod-like polycrystalline $Li_7La_3Zr_2O_{12}$ was prepared in the following procedure by using the polycrystalline $Li_7La_3Zr_2O_{12}$ powder that had passed the sieve in the above step. First, a mold made of rubber was filled with 26 g of the polycrystalline $Li_7La_3Zr_2O_{12}$ powder, followed by deaeration. The mold was then hermetically sealed, put in water, and retained in water at 40 MPa for 5 minutes. After the pressure of water was reduced, the molded product was taken out from the mold. The molded product had a columnar shape having a diameter of 1.2 cm and a height of 7 cm. Then, the molded product was calcined at 1150° C. for 8 hours in a box-type electric furnace (product of DENKEN, Model No. KDF009). The calcined product thus obtained had a rod-like and nearly columnar shape having a width of 1 cm and a length of 7 cm and it had a mass of 26 g. The powder X-ray diffraction pattern by a powder X-ray diffraction apparatus (product of Rigaku, Smart Lab) revealed that the calcined product was polycrystalline $Li_7La_3Zr_2O_{12}$ belonging to a tetragonal system.

Figure 2:
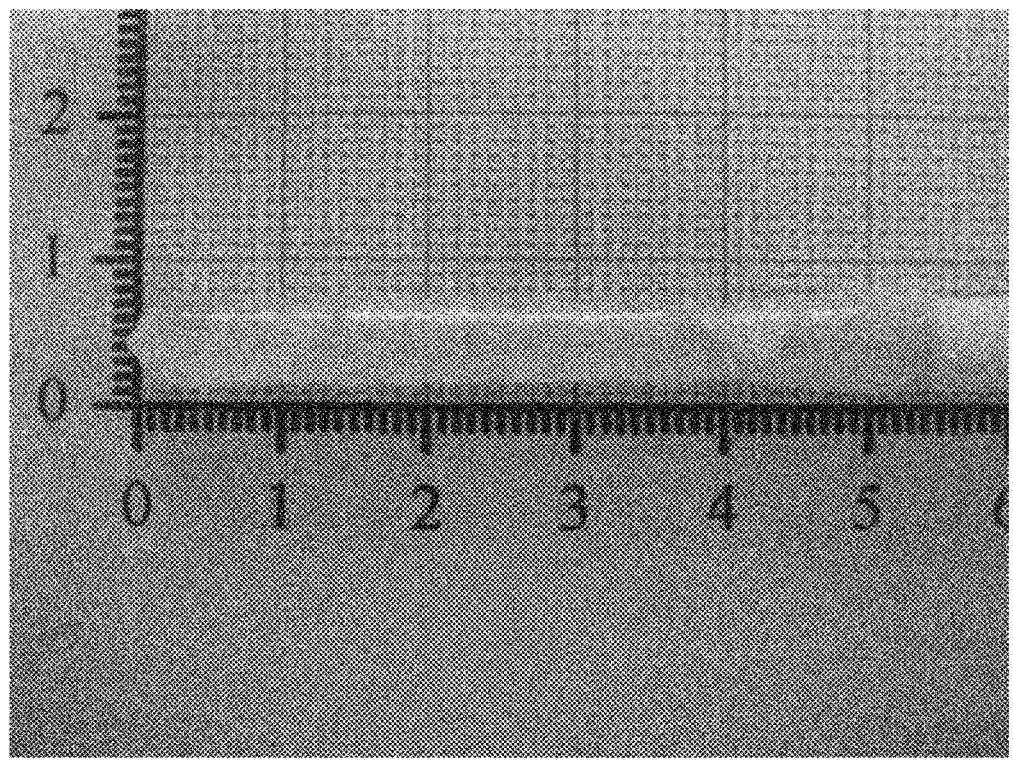
FIG. 2 is an appearance photograph of the tetragonal system $Li_7La_3Zr_2O_{12}$ crystal prepared by the FZ method of Example.

(3) Growth of $Li_7La_3Zr_2O_{12}$ Crystal
First, the rod-like polycrystalline $Li_7La_3Zr_2O_{12}$ raw material obtained by the above step was placed in a four ellipsoidal infrared condensing heating furnace (FZ furnace) (product of Crystal System, FZ-T-10000H model) equipped with a 100-kW halogen lamp and atmosphere was changed to dry air one. Next, the rod-like polycrystalline $Li_7La_3Zr_2O_{12}$ raw material was heated at an output of 51.9% while rotating it on a plane perpendicular to the longer direction at 45 rpm. After a while, a portion of the polycrystalline $Li_7La_3Zr_2O_{12}$ raw material was melted to form a melted portion. An installation base of the polycrystalline $Li_7La_3Zr_2O_{12}$ raw material was then lowered at a moving rate of 8 mm/h and 19 mm/h to grow a $Li_7La_3Zr_2O_{12}$ crystal. The appearance of the $Li_7La_3Zr_2O_{12}$ crystal (which may hereinafter be called "Sample 1") obtained by setting the moving rate of the installation base to 19 mm/h is shown in FIG. 2.

The structure of Sample 1 was analyzed using a single crystal X-ray diffraction analyzer (product of Rigaku Corporation, R-AXIS RAPID-II). The X-ray diffraction pattern of Sample 1 is shown in FIG. 3. As shown in FIG. 3, a clear diffraction point was measured. Diffraction intensity data were collected using a program RAPID AUTO attached to the single crystal X-ray diffraction analyzer and the crystal structure of Sample 1 was investigated using a crystal structure analysis program Jana2006. As a result, Sample 1 was found to belong to a tetragonal system. Sample 1 was cut by a diamond cutter to obtain four slices having a thickness of 0.1 mm. The relative density of them was calculated by the above-described method. As a result, the relative densities of them were found to be 99.0%, 99.4%, 99.7%, and 100%, respectively.

The lattice constants of Sample 1 were determined, using the least squares method, from the reflection observed in single crystal X-ray diffraction measurement. As a result, they were found to be a=1.3061 nm±0.0009 nm and c=1.3012 nm±0.0012 nm. The lattice constants revealed that Sample 1 was a lithium composite oxide having a garnet-related type structure. The lattice constants also revealed that compared with the crystal lattice of tetragonal system $Li_7La_3Zr_2O_{12}$ so far reported, Sample 1 was a novel tetragonal system garnet-related type structure $Li_7La_3Zr_2O_{12}$ having a crystal lattice closer to that of a cubic system. Even when the rotational speed of the polycrystalline $Li_7La_3Zr_2O_{12}$ raw material was set at 30 rpm and 60 rpm, a $Li_7La_3Zr_2O_{12}$ crystal having a relative density of 99% or more, belonging to a tetragonal system, and having a garnet related type structure was obtained.

Figure 4:
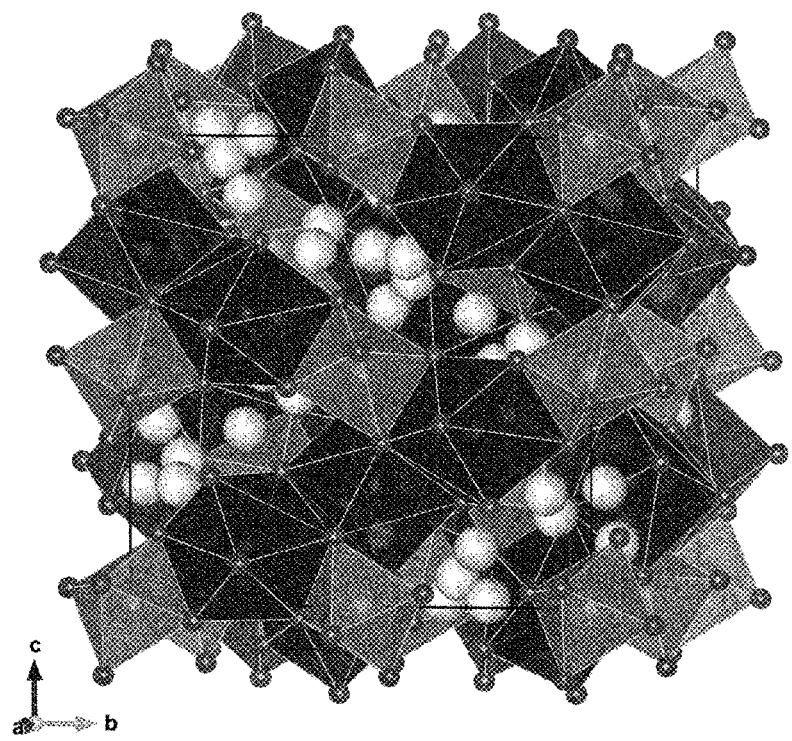
FIG. 4 is a schematic view showing the garnet-related type structure of the tetragonal system $Li_7La_3Zr_2O_{12}$ crystal prepared by the FZ method of Example.

The results of the crystal structure analysis of Sample 1 using a crystal structure analysis program Jana2006 based on the diffraction intensity data collected using a program RAPID AUTO attached to the single crystal X-ray diffraction analyzer are shown in FIG. 4. Compared with the tetragonal system garnet-related type structure so far reported, Sample 1 is different in arrangement of lithium ions and occupation state of lithium sites in the crystal structure. Tetragonal system $Li_7La_3Zr_2O_{12}$ so far reported has three lithium ion sites (8a site, 16f site, and 32g site) in the crystal structure and their occupancies are 100%, while Sample 1 has five, but four in the number of kinds, lithium ion sites (8a site, 16f site, two 32g sites, and 16e site) in the crystal structure and their occupancies were from 30 to 50%.

Figure 5:
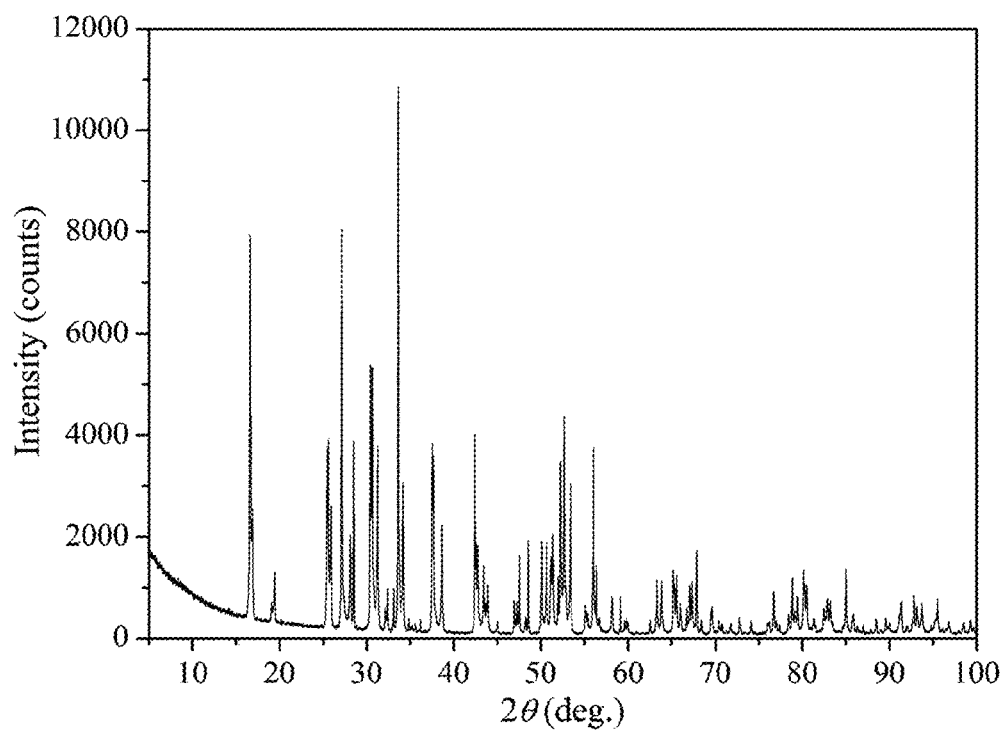
FIG. 5 is a powder X-ray diffraction pattern of the tetragonal system $Li_7La_3Zr_2O_{12}$ crystal prepared by the FZ method of Example.

This means that Sample 1 had Li on four kinds of ion sites, that is, 8a site, 16f site, 32g site, and 16e site. The arrangement of lithium ions changes and becomes close to the arrangement of lithium ions of $Li_7La_3Zr_2O_{12}$ having a cubic system garnet-related type structure so far reported. It is therefore presumed that the lattice constants of Sample 1 become close to those of a cubic system. The above-described crystal structure analysis results are said to be appropriate because an R factor, indicating the reliability of the crystal structure analysis, is 7.46%. FIG. 5 shows the results of powder X-ray diffraction measurement of Sample 1 after grinding. The powder X-ray diffraction pattern of Sample 1 was similar to that of the $Li_7La_3Zr_2O_{12}$ having a tetragonal system garnet-related type structure so far reported. The lattice constants calculated from the results of the powder X-ray structure analysis were a=1.31270 nm±0.00002 nm and c=1.26882 nm±0.00003 nm.

(4) Measurement of Lithium Ion Conductivity of $Li_7La_3Zr_2O_{12}$ Crystal

Figure 6:
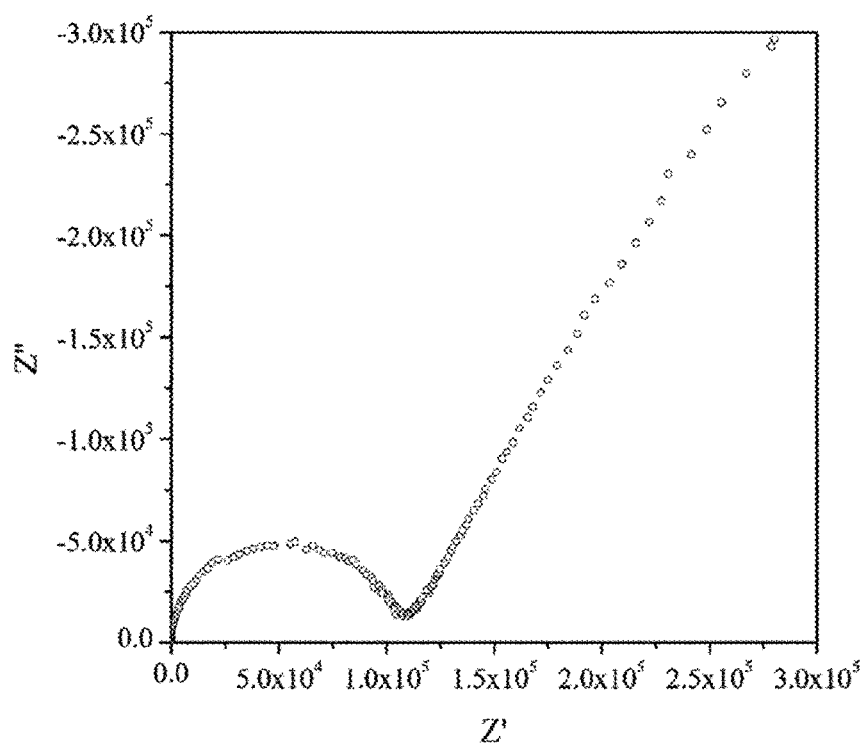
FIG. 6 is a Nyquist plot of the tetragonal system $Li_7La_3Zr_2O_{12}$ crystal prepared by the FZ method of Example.

First, Sample 1 was cut into a columnar thin slice having a diameter of about 1.0 cm and a thickness of about 0.19 cm. Then, a rectangular parallelepiped shaped gold having a square bottom surface 0.18 cm on a side and a thickness of 40 nm was sputtered onto both surfaces of the thin slice to form an electrode. Impedance of Sample 1 was measured at 25° C. in a nitrogen atmosphere by the ac impedance method (apparatus used for measurement: Solarton, 1260). The Nyquist plot at that time is shown in FIG. 6. The lithium ion conductivity found from the Nyquist plot shown in FIG. 6 was $4.6 \times 10^{-5}$ S/cm.

2. Preparation of $Li_7La_3Zr_2O_{12}$ Crystal by CZ Method (1) Preparation of Polycrystalline $Li_7La_3Zr_2O_{12}$ Powder A sieved polycrystalline $Li_7La_3Zr_2O_{12}$ powder was prepared in a manner similar to that described above in "preparation of polycrystalline $Li_7La_3Zr_2O_{12}$ powder" in "production of $Li_7La_3Zr_2O_{12}$ crystal by FZ method".

(2) Growth of $Li_7La_3Zr_2O_{12}$ Crystal

First, a cylindrical iridium container having an inner diameter of 2.6 cm and a depth of 2.8 cm was filled with 38 g of the polycrystalline $Li_7La_3Zr_2O_{12}$ powder obtained in the above step. The iridium container was then placed in a single crystal pulling furnace (CZ furnace) (product of TECHNO SEARCH, TCH-3) equipped with high-frequency induction heating function. A tungsten rod 0.8 mm long was placed in a pulling unit and the CZ furnace was adjusted to have a dry nitrogen atmosphere. Next, the high frequency output was increased gradually and the iridium container was heated continuously at an output of 76.2%. After a while, the $Li_7La_3Zr_2O_{12}$ powder in the iridium container was melted.

Figure 7:
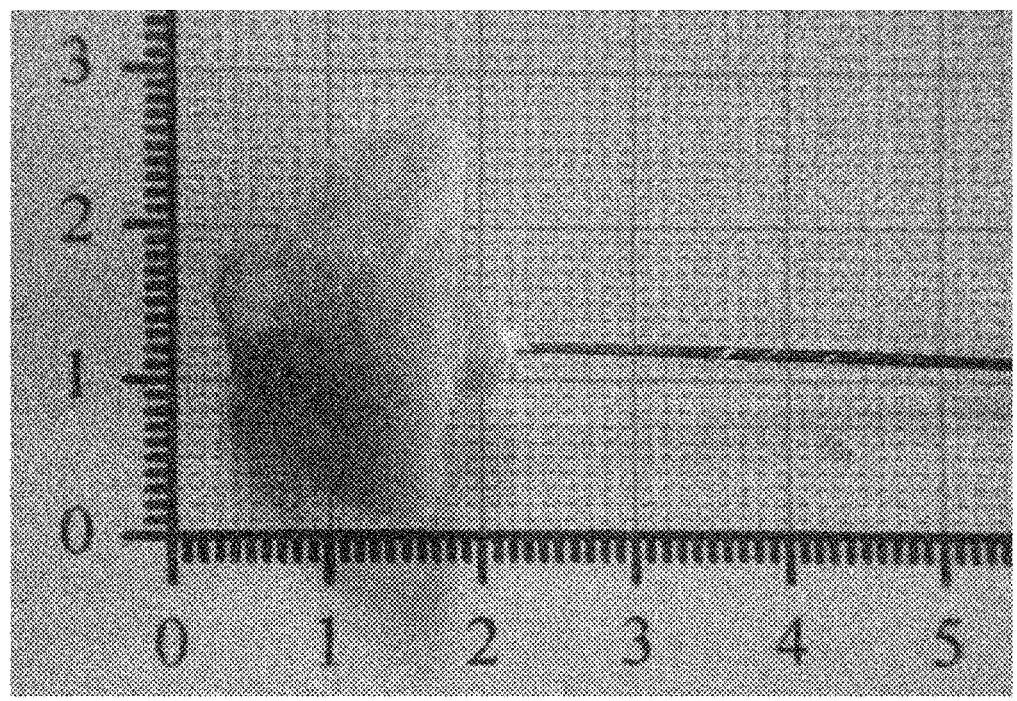
FIG. 7 is an appearance photograph of a tetragonal system $Li_7La_3Zr_2O_{12}$ crystal obtained by the CZ method of Example.
Figure 8:
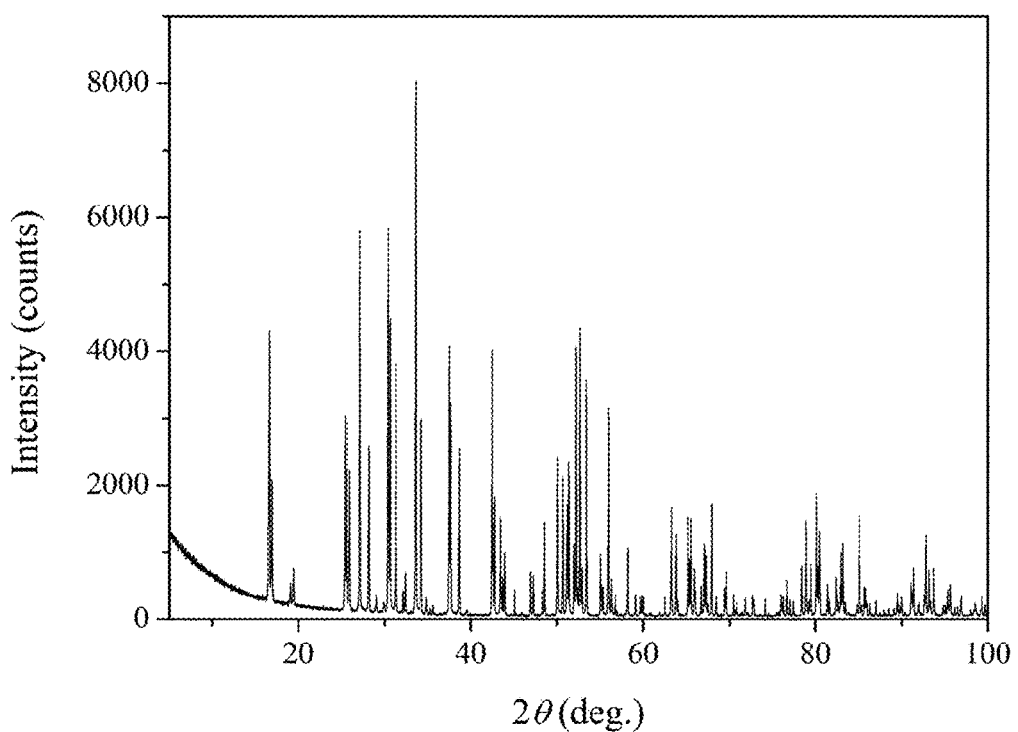
FIG. 8 is a powder X-ray diffraction pattern of the tetragonal system $Li_7La_3Zr_2O_{12}$ crystal prepared by the CZ method of Example.

After the resulting tungsten rod was put in the melted portion of $Li_7La_3Zr_2O_{12}$ while rotating it at 10 rpm on a plane perpendicular to the longer direction, the tungsten rod was elevated at a moving rate of 10 mm/h to grow a $Li_7La_3Zr_2O_{12}$ crystal. The appearance of the $Li_7La_3Zr_2O_{12}$ crystal thus grown (which may hereinafter be called "Sample 2") is shown in FIG. 7. The results of powder X-ray diffraction measurement of Sample 2 after grinding are shown in FIG. 8.

The powder X-ray diffraction pattern of Sample 2 was similar to that of $Li_7La_3Zr_2O_{12}$ having a tetragonal system garnet-related type structure so far reported. The lattice constants calculated based on the results of powder X-ray structure analysis were a=1.31322 nm±0.00001 nm and c=1.26703 nm±0.00001 nm. The results of the single crystal X-ray diffraction measurement and the powder X-ray structure analysis of the $Li_7La_3Zr_2O_{12}$ crystal produced by the FZ method and the results of the powder X-ray structure analysis of the $Li_7La_3Zr_2O_{12}$ crystal produced by the CZ method used in combination show that the lattice constants of the $Li_7La_3Zr_2O_{12}$ crystal are 1.3052 nm≤a≤1.31323 nm and 1.26702 nm≤c≤1.3024 nm.

INDUSTRIAL APPLICABILITY

The lithium-containing garnet crystal body of the present invention can be used as a material of a solid electrolyte of all-solid-state lithium ion secondary batteries and the like.

What is claimed is:

1. A $Li_7La_3Zr_2O_{12}$ single crystal having a relative density of 99% or more, belonging to a tetragonal system, having a garnet-related type structure, having lattice constants of 1.3052 nm≤a≤1.31323 nm and 1.26702 nm≤c≤1.3024 nm, and having Li on four kinds of ion sites, that are 8a site, 16f site, 32g site, and 16e site.

2. The $Li_7La_3Zr_2O_{12}$ single crystal according to claim 1, wherein the relative density is 100%.

3. The $Li_7La_3Zr_2O_{12}$ single crystal according to claim 1, which satisfies at least one of the following conditions (1) and (2): (1) the Nyquist plot of the crystal body by ac impedance measurement does not show a resistance component due to crystal grain boundaries but only a resistance component of a material itself; and (2) in X-ray diffraction measurement, neutron diffraction measurement, or electron diffraction measurement using a single crystal, a ring-shaped diffraction spot appears in a diffraction pattern.

4. A method of producing a $Li_7La_3Zr_2O_{12}$ single crystal according to claim 1, comprising melting at least a portion of a raw material composed of polycrystalline $Li_7La_3Zr_2O_{12}$ to form a melted portion and moving the melted portion, wherein: a moving rate of the melted portion is 8 mm/h or more, and the $Li_7La_3Zr_2O_{12}$ single crystal has a relative density of 99% or more.

5. The method of producing a $Li_7La_3Zr_2O_{12}$ single crystal according to claim 4, wherein the moving rate is 8 mm/h or more but not more than 19 mm/h.

6. The method of producing a $Li_7La_3Zr_2O_{12}$ single crystal according to claim 4, wherein a portion of the raw material in rod form is melted while rotating the raw material on a plane perpendicular to the longer direction; and the melted portion is moved in the longer direction.

7. The method of producing a $Li_7La_3Zr_2O_{12}$ single crystal according to claim 6, wherein the raw material is rotated at a rotational speed of 30 rpm or more.

8. The method of producing a $Li_7La_3Zr_2O_{12}$ single crystal according to claim 7, wherein the rotational speed of the raw material is 30 rpm or more but not more than 60 rpm.

9. The method of producing a $Li_7La_3Zr_2O_{12}$ single crystal according to claim 4, wherein the polycrystalline $Li_7La_3Zr_2O_{12}$ and the $Li_7La_3Zr_2O_{12}$ single crystal belong to a tetragonal system.

10. The method of producing a $Li_7La_3Zr_2O_{12}$ single crystal according to claim 4, wherein the $Li_7La_3Zr_2O_{12}$ single crystal has a relative density of 100%.

11. The method of producing a $Li_7La_3Zr_2O_{12}$ single crystal according to claim 4, wherein melting of the raw material and moving of the melted portion are performed in a dry air atmosphere.

12. An all-solid-state lithium ion secondary battery comprising a positive electrode, a negative electrode, and a solid electrolyte, wherein the solid electrolyte has the $Li_7La_3Zr_2O_{12}$ single crystal as claimed in claim 1.

\* \* \* \* \*